US007127584B1

(12) United States Patent
Thompson et al.

(10) Patent No.: US 7,127,584 B1
(45) Date of Patent: Oct. 24, 2006

(54) SYSTEM AND METHOD FOR DYNAMIC RANK SPECIFIC TIMING ADJUSTMENTS FOR DOUBLE DATA RATE (DDR) COMPONENTS

(75) Inventors: Derek A. Thompson, Portland, OR (US); Darrell S. McGinnis, Hillsboro, OR (US); John F. Zumkehr, Orange, CA (US)

(73) Assignee: Intel Corporation, Santa Clara, CA (US)

( * ) Notice: Subject to any disclaimer, the term of this patent is extended or adjusted under 35 U.S.C. 154(b) by 418 days.

(21) Appl. No.: 10/713,718

(22) Filed: Nov. 14, 2003

(51) Int. Cl.
*G06F 12/00* (2006.01)
(52) U.S. Cl. .................. 711/169; 711/169; 365/193; 365/233
(58) Field of Classification Search ............. 711/169, 711/167; 365/233, 193
See application file for complete search history.

(56) References Cited

U.S. PATENT DOCUMENTS

| | | | | |
|---|---|---|---|---|
| 5,577,236 A | * | 11/1996 | Johnson et al. | 713/400 |
| 5,623,638 A | * | 4/1997 | Andrade | 711/167 |
| 6,134,638 A | * | 10/2000 | Olarig et al. | 711/167 |
| 6,208,563 B1 | * | 3/2001 | Naritake | 365/189.05 |
| 6,442,644 B1 | * | 8/2002 | Gustavson et al. | 711/105 |
| 6,496,906 B1 | * | 12/2002 | Novak et al. | 711/154 |
| 6,715,096 B1 | * | 3/2004 | Kuge | 713/600 |
| 2003/0140208 A1 | * | 7/2003 | LaBerge et al. | 711/170 |
| 2003/0145162 A1 | * | 7/2003 | Casper et al. | 711/105 |

* cited by examiner

*Primary Examiner*—Sanjiv Shah
*Assistant Examiner*—Yaima Campos
(74) *Attorney, Agent, or Firm*—Troutman Sanders LLP; Gerald R. Boss; James Hunt Yancey, Jr.

(57) ABSTRACT

In some embodiments, a system and method for making rank-specific adjustments to the READ tenure parameters of a double data-rate (DDR) memory component to improve the DDR bus timing margins. When a READ tenure is encountered for the DDR memory component, the rank of the DDR memory component is calculated and the value is used to retrieve two adjustment signals, which are specific to the DDR memory component, from the look up table. One of the adjustment signals is used to adjust a gating signal for the data strobe signal of the component. The other adjustment signal is used to fine tune a required ¼ clock delay for the data strobe signal to read the data from the DDR memory component while adjusting for the inherent latency of the DDR memory component. Other embodiments are described and claimed.

19 Claims, 5 Drawing Sheets

SYSTEM AND METHOD FOR DYNAMIC RANK SPECIFIC TIMING ADJUSTMENTS FOR DOUBLE DATA RATE (DDR) COMPONENTS

TECHNICAL DESCRIPTION OF THE INVENTION

The present invention is directed to memory management and more particularly to dynamically adjusting timing parameters for rank-specific DDR memory components.

BACKGROUND

Dual data-rate (DDR) memory is a type of synchronized dynamic random access memory (DRAM) that supports data transfers on both edges of each clock cycle (the rising and falling edges), thereby effectively doubling the memory chip's data throughput. DDR memory consumes less power than conventional or single data-rate (SDR) memory, which makes it popular and well-suited for a wide variety of applications.

In a typical DDR memory, the memory array is arranged in multiple ranks. Each rank typically contains between four (4) and eighteen (18) unique DDR memory components. When a READ tenure is initiated to read data from a DDR memory component, the DDR memory uses a source-synchronous data strobe signal to deliver the data from the DDR memory component to the memory controller hub (MCH). That is, each DDR component has its own data strobe signal where the synchronization is provided by the individual memory module rather than the system clock of the MCH. However, the timing window for the data strobe signal and the arrival of the data can vary dramatically between different DDR memories. For example, one manufacturer may produce a DDR memory with a data strobe signal that has large timing window for the data strobe signal, while a different manufacture may produce a DDR memory with a small timing window for the data strobe signal.

Additionally, latency inherently exists between the time a read data request is made, i.e., the time data strobe signal is applied to the specified rank, and the time the read data becomes available on the DDR bus. This latency typically will vary between individual ranks within a given DDR memory. For example, all of the components within a given rank will have a specified latency while the components of another rank of the DDR memory will have a specified latency that is different from the latency of the other ranks. Furthermore, there are inherent time variations for reading data out between individual DDR components within a given rank.

Unfortunately, these variations in the timing window for the data strobe signal and between components of a given rank require large timing margins, which consume precious systems resources. The problem is further compounded in that many computer systems mix DDR memory modules from different manufacturers. Thus, the timing margins for the system must be large enough to accommodate the DDR memory with the largest timing window. If a DDR memory module is used that has better tolerances and requires a tighter timing window, system resources allocated for the timing margins are lost, which reduces the efficiency of the system and increases operating costs.

One solution to reduce the timing margins and increase system efficiency was to compensate for the latency between ranks within the DDR memory by applying a static DQS_OFFSET signal through the BIOS. Although the use of static DQS_OFFSET signals to compensate for the latency between ranks reduced the timing margins to a certain degree, the timing margins still had to be unduly large to accommodate for the latency between DDR memory modules made by varying manufactures. Furthermore, the static DQS_OFFSET signal could not account for the inherent latency between individual DDR components within a given rank. Although the use of static DQS_OFFSET signal reduced the timing margins to a certain degree, the timing margins associated with the DDR memories are still too large and consume too many system resources.

Therefore, there is a continuing need in the art for a method to improve DDR bus timing margins for READ tenures. In particular, there is a need for a method for adjusting the DDR bus timing margin to account for the variations

DETAILED DESCRIPTION OF THE EMBODIMENTS

The present invention is typically embodied in a system and method for making rank-specific adjustments to timing parameters of memory component to improve the bus timing margins. Although the present invention is described in terms of adjusting timing parameters for double data-rate (DDR) memory components, those skilled in the art will appreciate that the term DDR encompasses all DDR memory devices, such as DDR-SDRAM, DDR-II, and the like. The present invention is typically employed within a memory controller hub (MCH) of a chipset architecture. During the power on self test (POST) sequence when the chipset is powered on, the timing of the arrival time of a data bit to associated with the data strobes are measured across the individual components for each rank of the DDR memory. The timing measurements are then passed to a DQS Measurement Function, which calculates a DQS_OFFSET value for each component. The DQS_OFFSET value is then used to adjust the data strobe signal for the associated DDR memory component. The DQS_OFFSET values are then stored as an entry in a look-up table. Each one of the table entries is associated with a unique component for each rank of the DDR memory device.

In addition to the DQS_OFFSET values, each table entry RECVEN_DLY parameter. The RECVEN_DLY value contains two parts: a whole number portion and a fractional portion. The whole number portion is used to make gross adjustment to the timing parameters, while the fraction portion is used to make fine adjustments to the timing parameters. The RECVEN_DLY values are soft coded into the look-up table and may be updated whenever the DDR memory is changed.

After the MCH has been powered on the table populated with the appropriate DQS_OFFSET values, the method is initiated upon the commencement of a READ tenure. The READ tenure, which contains the read command and address of the READ data, is input to a Tenure Command FSM. The Tenure Command FSM examines the READ tenure and address is used to calculate the appropriate rank associated with the READ data. The calculated rank is then passed to the look-up table and is used as a pointer to the appropriate table entry associated with the rank and DDR component.

The look-up table retrieves the RECVEN_DLY and DQS_OFFSET parameters and passes them through a configurable pipeline, known as the data tenure pipeline. The data tenure pipeline extracts the whole number portion of RECVEN_DLY signal places both RECVEN_DLY signal and the DQS_OFFSET signal in a register. Additionally, a READ_CMD signal, which initiates the read tenure, is passed through the data tenure pipeline. The data tenure pipeline then sets a timer to a value equal to the value of the extracted whole number portion. Once the value of the timer reaches value of the whole number portion, the RECVEN_DLY signal and the DQS_OFFSET signal are clocked out of the register to a DDR I/O Cell through the MCH crossbar. By holding the RECVEN_DLY signal and the DQS_OFFSET signal in the pipeline, imparts an appropriate delay on the arrival of the timing adjustment parameters.

At the DDR I/O Cell, the fractional portion of the RECVEN_DLY signal and the READ_CMD signal are input to an adjustable pipeline. The adjustable pipeline acts in a similar manner to that of the data tenure pipeline. A timer within the adjustable pipeline is set to a value equal to the fractional portion of the RECVEN_DLY signal. When the timer reaches the value of the fractional portion of the RECVEN_DLY signal, the READ_CMD is clocked out to a one-shot pulse stretch circuit. The one-shot pulse stretcher circuit expands the delayed READ_CMD signal for an additional clock pulse. The output of the one-shot pulse stretch circuit is a pulse that remains in a high state for two clock cycles. The stretched pulse is then input to a logical AND gate with the bi-directional data strobe of the particular DDR component. Thus, in this manner, the expanded output of the one shot pulse circuit acts as a gating signal for the data strobe signal. The output of the logical AND gate is used to drive a clock circuit that has been shifted by ¼ of a clock pulse. The clock circuit also receives the DQS_OFFSET value to perform any fine adjustments to account for any component timing variations within the given rank. The clock signal output is a pair of data strobe pulses shifted in time by a ¼ clock pulse so that the eyes of the pulses are synchronized with the transition regions of the data signal. The conditioned data strobe signal is then input to a D flip-flop to capture the data signal. Alternatively, the data strobe signal may be input to a latch to capture the data signal. By having the unique adjustment to the data strobe signals for every component of each rank of memory, the limited distribution of values for the rank DDR components can be exploited to achieve additional timing margins, and thereby increase the efficiency of the system while simultaneously freeing up resources that can be used elsewhere within the system.

Figure 1:
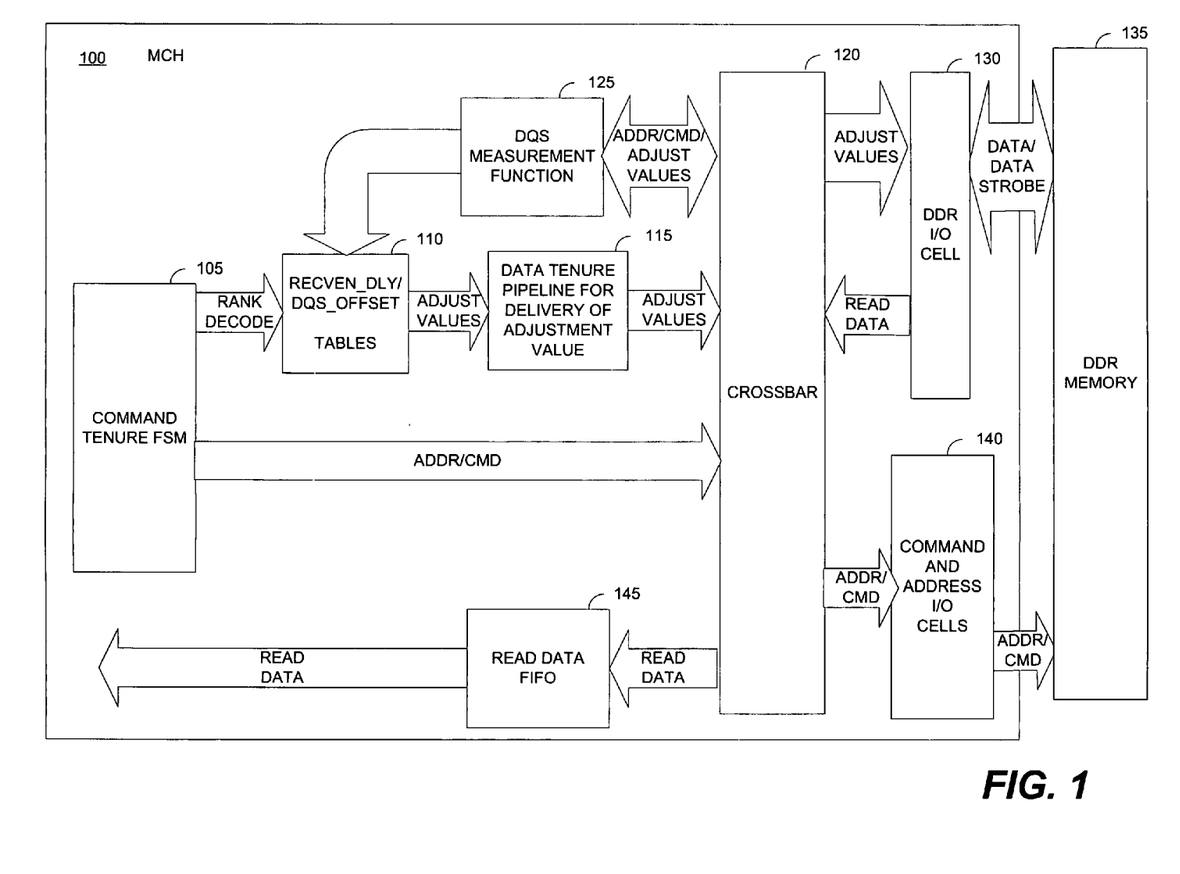
FIG. 1 is block diagram illustrating a DDR input/output (I/O) cell for providing dynamic rank specific timing adjustments for DDR components operating with a memory controller hub (MCH) environment in accordance with some embodiments of the present invention.

Turning now to the figures, in which like numerals refer to like elements through the several figures, FIG. 1 is a block diagram illustrating a memory controller hub (MCH) 100 employing the present invention. Initially, the memory transactions require access to the memory module 135. When a READ tenure is generated, the READ tenure contains two distinct tenures that are separate in time, a command and address a data tenure and tenure. The command and address tenure contains the READ command signal and the address of the location in the DDR memory 130 that contains the READ data. The READ command and address tenure is input to a Command Tenure FSM 105, which reads the address and calculates the rank of the DDR component. The Command Tenure FSM 105 then passes the READ command and address unfettered to the Crossbar 120, which routes the READ command and address to the command and address I/O cells 140 and then to the memory 130.

The Command Tenure FSM 105 send the calculated rank to a look-up table 110 that contains an array of data consisting of a RECVEN_DLY and a DQS_OFFSET parameters to adjust the data strobe associated with the rank of each component in the DDR memory. The RECVEN_DLY parameter is composed of two distinct portions, a whole number portion, and a fractional portion, that are specific to each rank of the DDR memory. The whole number portion is used adjust the data strobe signal by multiples of whole clock pulse to make gross adjustments between ranks within the DDR memory. The fractional portion RECVEN_DLY represents the fine adjustment consisting of fractions of clock pulses made to the data strobe signal.

The DQS_OFFSET parameter represents a fine adjustment for the data strobe signal to account for timing variations between individual components within a given rank. For example, memories are typically arranged in multiple ranks of components, which are usually formed within the DIMM. Each rank will typically have between 4 and 18 unique DDR components. Normally, there is a slight variation of the data strobe signal from component-to-component. The DQS_OFFSET parameter is used to adjust the data strobe signal to account for these component-to-component timing variations.

Once the RECVEN_DLY and DQS_OFFSET parameters associated with the particular component have been retrieved, the Command Tenure FSM 105 passes these parameters to a Data Tenure Pipeline 115. The Data Tenure Pipeline 115 is a configurable pipeline delays delivering these signals. The Data Tenure Pipeline 115 extracts the whole number portion of the RECVEN_DLY parameter and places the fractional portion of the RECVEN_DLY and the DQS_OFFSET parameters into registers. The Data Tenure Pipeline 115 imparts a delay equal to the value of the whole number portion of the RECVEN_DLY parameter by setting a clock to the value of the whole number portion. The fractional portion of the RECVEN_DLY and the DQS_OFFSET parameters are held in the registers until the clock counts down to zero, at which time the fractional portion of the RECVEN_DLY and the DQS_OFFSET parameters are clocked out to the DDR I/O Cell 130 through the Crossbar 120.

The DDR I/O Cell 130 reads the fractional portion of the RECVEN_DLY and the DQS_OFFSET parameters and adjusts the data strobe signal for the READ command accordingly. The adjusted data strobe signal is used in conjunction with the READ tenure and address, which were forwarded unfettered to the memory component 135 by the Command Tenure FSM 105, to extract the data from the appropriate memory location. The data is then output to the DDR I/O Cell 130 and to a READ DATA FIFO Register 140 through the Crossbar 120.

Figure 2:
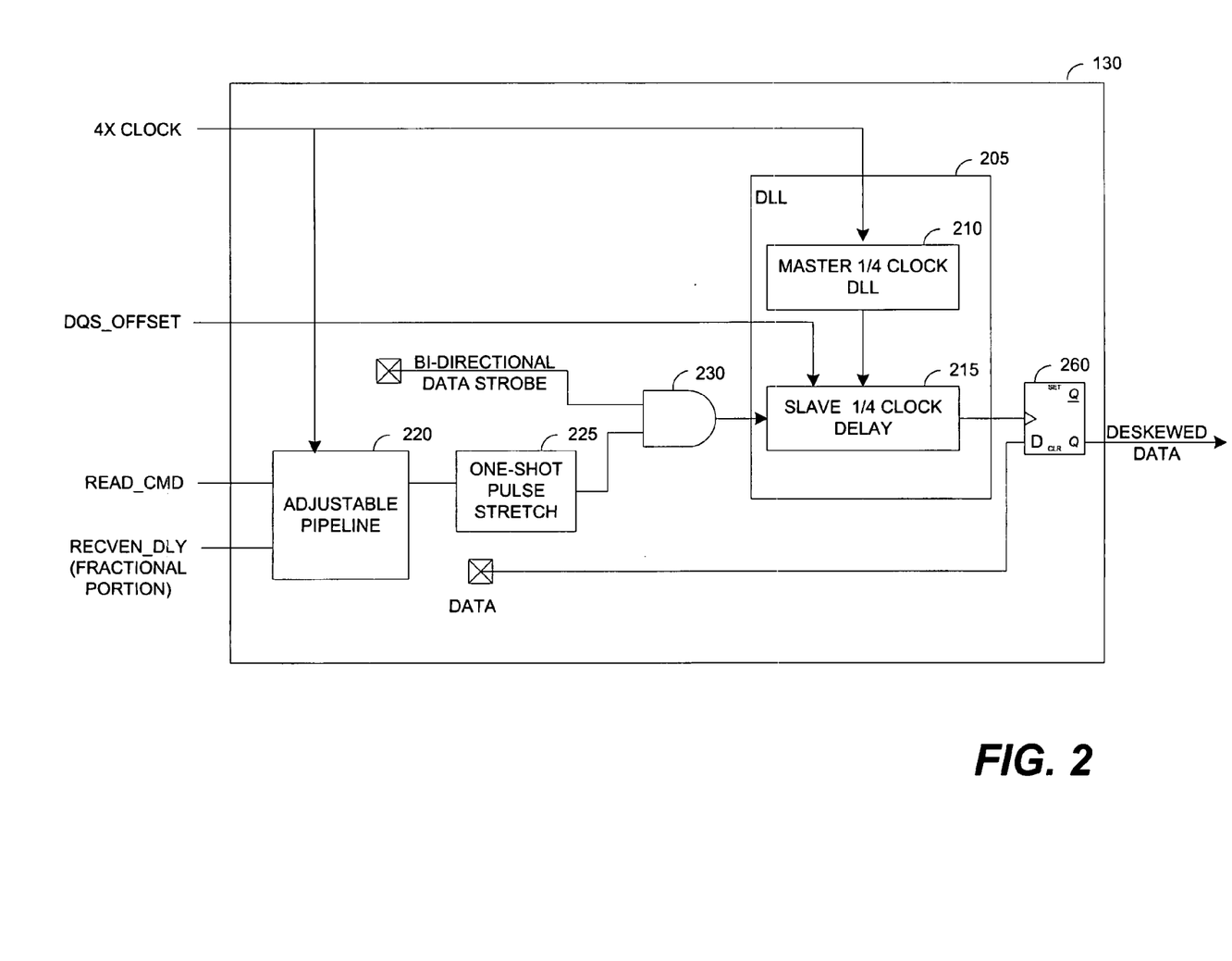
FIG. 2 is a block diagram illustrating a DDR input/output (I/O) cell for providing dynamic rank specific timing adjustments for DDR components in accordance with some embodiments of the present invention.

FIG. 2 is a block diagram illustrating a single DDR I/O cell 130 in accordance with the present invention. It should be noted that a DDR I/O Cell 130 exists for each component for each rank of the DDR Memory Module 135. However, for the present application, the invention will be described in terms of a single DDR I/O Cell 135.

In addition to receiving the fractional portion of the RECVEN_DLY parameter and the DQS_OFFSET parameter, the DDR I/O Cell 130 receives a clock signal 235. The clock signal 235 is stepped up to a rate that is 4 times (4×) the system clock. Generating a 4× clock signal 235 allows for convenient and simple method for generating the ¼ clock shift of the data strobe signal needed for reading the data from the DDR component. It allows for a conventional master ¼ DLL clock and a slave ¼ DLL clock DLL, which are easily implemented, to be used to generate the ¼ shift of the clock signal. The use of the 4× clock signal 235 avoids additional clock logic circuitry in the DDR I/O Cell 130 that would be needed to produce the ¼ delay of the clock signal if the clock signal was less then 4× the system clock signal. Those skilled in the art, however, will appreciate that the clock rate 235 may be any multiple of the system clock. However, using a multiple other than 4× the system clock will require additional complexity and cost of the DDR I/O Cell 130.

Within the DDR I/O Cell 130, the 4× clock signal is split into two signals. One of the 4× clock signals 235 goes to a DLL 205 to generate the ¼ clock shift and the other 4× clock signal 235 is input to an Adjustable Pipeline 220. The Adjustable Pipeline 220 also receives the fractional portion of the RECVEN_DLY signal and the READ_CMD signal.

The Adjustable Pipeline 220 reads the value of the fraction portion of RECVEN_DLY signal and imparts a delay on the READ_CMD signal equal to the value fractional portion. When the READ_CMD trigger signal goes "high," the Adjustable Pipeline 220 passes it, after the appropriate delay, to a One-Shot Pulse Stretch generator 225, which "stretches" the READ_CMD signal for an additional clock cycle. Thus, the READ_CMD signal is held high for a total of two clock pulses. Although the READ_CMD signal is stretched for a single clock cycle, those skilled in the art will appreciate that the READ_CMD signal may be stretched for any number of clock cycles required to read the data from the DIMM components without departing from the scope of the invention.

The stretched READ_CMD signal is then input to a logical AND gate 230 where it is logically combined with the data strobe signal from the DDR component. The logical AND gate 230 generates a signal when both the READ_CMD and data strobe signals are both present. Therefore, because the READ_CMD signal is stretch for two clock cycles, the READ_CMD signal is gating signal for the data strobe signal. Thus, once the appropriate number of data strobe signal are passed for reading out the data from the component of the DDR memory 135, the READ_CMD signal is removed and therefore, the output of the logical AND gate 230 will fall to zero, thereby terminating the READ tenure.

The gated output of the AND gate 230 is input to a slave ¼ clock delay circuit 215, which places a ¼ phase delay on the each of the gated pulses. The slave ¼ clock delay circuit 215 is driven by a master clock DLL 210, which is a configurable rank oscillator that is matched to the 4× clock signal. The master ¼ clock DLL 210 receives the 4× clock signal and generates an output voltage that is that corresponds to a delay in time by ¼ of the clock cycle. The output voltage is then used to drive the slave ¼ clock delay circuit 215. Thus, the slave ¼ clock delay circuit 215 is tied to the 4× clock signal. The slave ¼ clock delay circuit 215 imparts a ¼ clock delay on the output signal of the AND gate 230, which means that a ¼ clock delay is applied to the conditioned gated data strobe signals.

The conditioned data strobe signal is then applied to the input of a D-flip flop gate 260. The data to be read from the DIMM is input to the D input of the D-flip flop gate 260. Therefore, whenever the conditioned data strobe signal goes high, the data is read out through the Q output of the D-flip flop gate 260.

Figure 3:
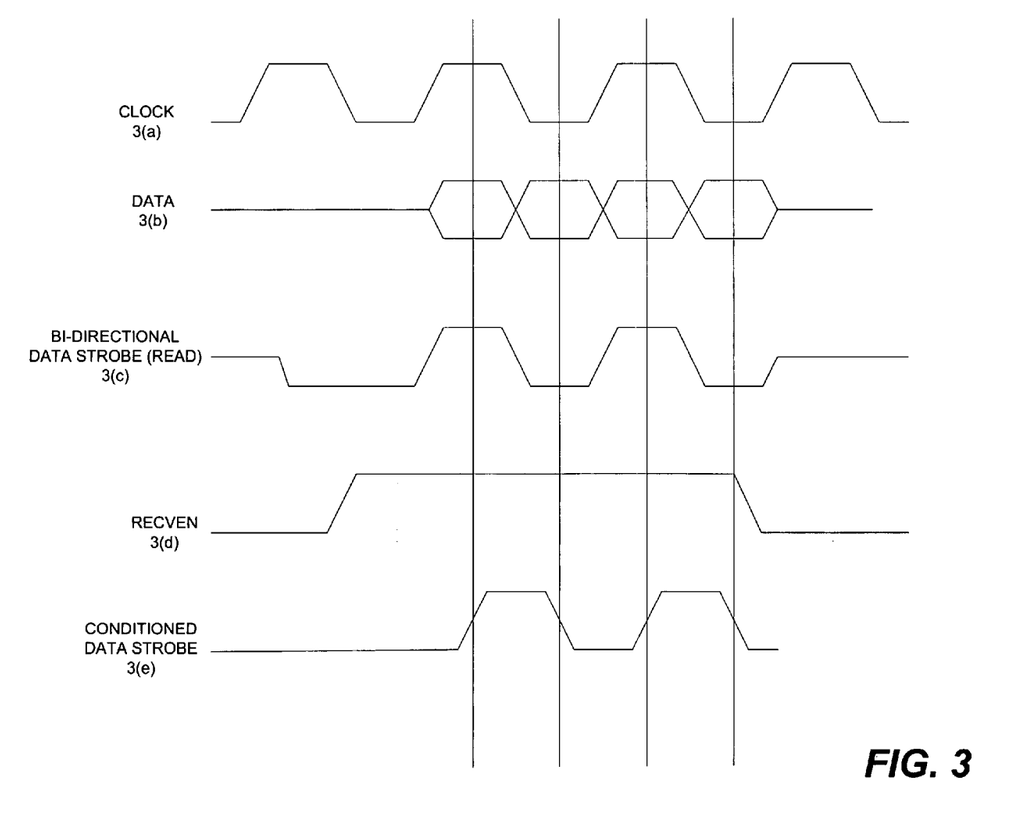
FIG. 3 is a timing diagram illustrating a conditioned data strobe signal after being dynamically adjusted in accordance with some embodiments of the present invention.

FIG. 3 is a timing diagram illustrating the timing relationship between the system clock signal and the timing signals in the DDR I/O Cell 130. The system clock is represented in 3(*a*). Data pulses 3(*b*) are presented at the input of the D-flip flop 260 in synchronization with the system clock. The bi-directional data strobe signal 3(*c*) is also synchronized with the clock signal 3(*a*). The bi-directional data strobe signal 3(*c*) is a tri-state signal, which transitions to a "high" state to indicate a READ operation. The RECVEN signal 3(*d*) acts as a gating signal for the bi-directional data strobe signal 3(*c*). The RECVEN signal is output by the one-shot pulse stretch circuit 225 (FIG. 2) and remains in a "high" state for two clock pulses. During this time, two data strobe pulses are passed through the logical AND gate 230 to the DLL clock circuit 205. The position of the RECVEN signal is governed by the whole portion and the fractional portion of the RECVEN_DLY signal. The whole portion and fractional portion are used to position the RECVEN signal so that the beginning of the "high" state of the RECVEN signal is placed directly in the middle of the "low" state prior to the first "read" bi-directional data strobe pulse. Placing the beginning of the "high" state of the RECVEN in the middle of the "low" state prior to the read data pulse provides the greatest savings of timing margin. If the RECVEN signal is placed too early, that is at a time earlier than in the middle of the "low" state, the bi-directional data strobe signal would be enabled during a transition from the tri-state, which would introduce unwanted noise into the logic circuit. Furthermore, the data would not be read if the RECVEN signal is positioned too early since at least a portion of the second data strobe would likely be clipped. Conversely, if the RECVEN is positioned later than the center of the "low" state prior to the READ, that is closer to the transition to the "high" state f the data strobe, it is likely that the first pulse of the bi-directional data strobe would be clipped. Again, this would mean that the portion of the data would not be read.

Lastly, the Conditioned Data Strobe signal 3(e) illustrates the bi-directional data pulses after they have been gated by the logical AND gate and delayed ¼ of a clock pulse by the DLL clock circuit 205. The eye of the data pulses are now lined up with the transitional states of the data strobe pulses, which allows the data pulsed to be properly read from the D flip-flop 260.

Figure 4:
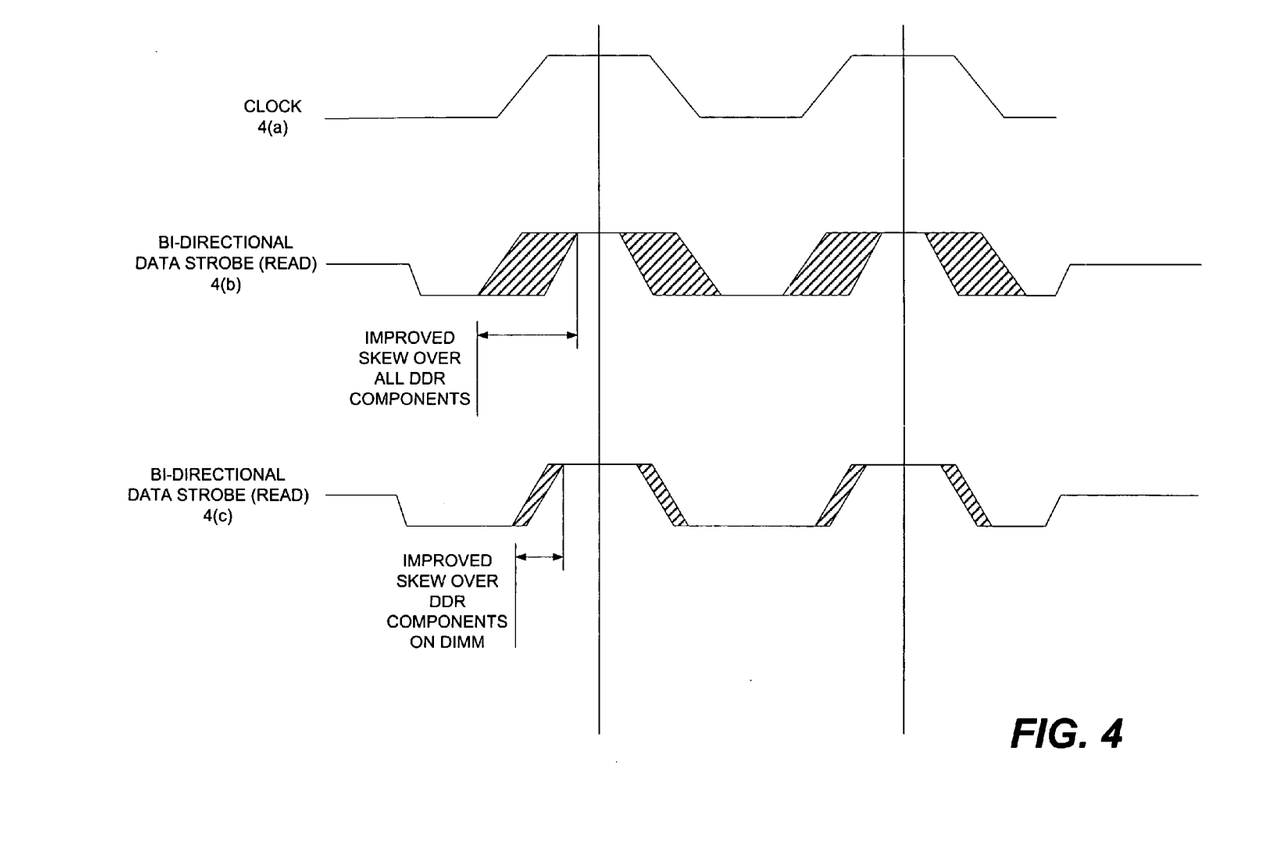
FIG. 4 is a timing diagram illustrating an increase in timing margin in accordance with some embodiments of the present invention.

FIG. 4 is an illustration of improved skew of the data strobe signal. The timing diagram of 4(a) illustrates the improved skew over all DDR components from rank to rank and the improvement in the READ timing margins and 4(b) illustrates the improved skew over the DDR components in a given rank, which is attained by using the RECVEN_DLY and DQS_OFFSET signal to precisely place the bi-direction data strobe in the eye of the data pulse. The improvement in the READ timing margins translates into many positives at the system level, such as increasing the mean time between failures (MTBF), and reduction in system and maintenance costs.

Figure 5:
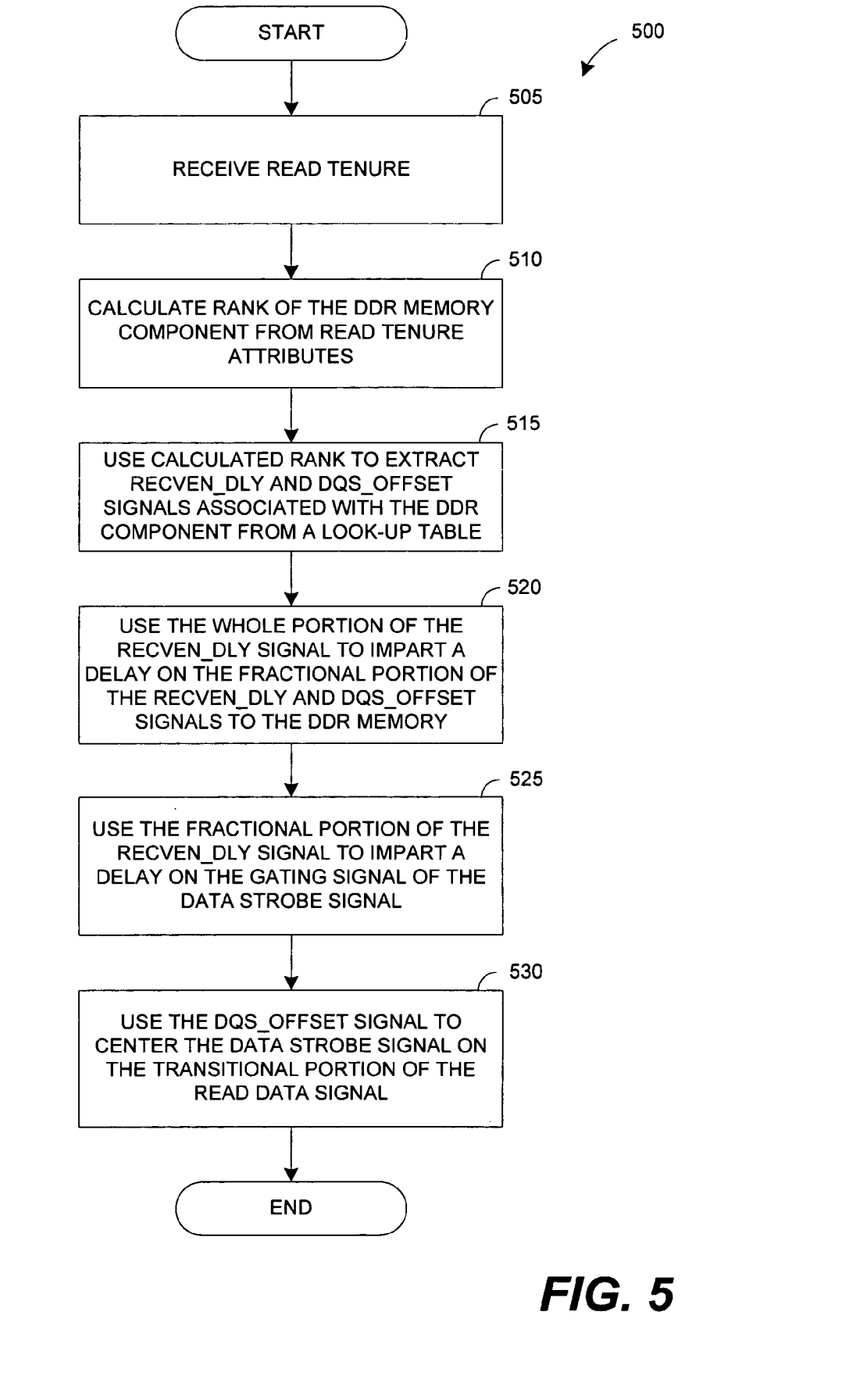
FIG. 5 is a logic flow diagram illustrating a routine for making rank-specific timing adjustments for individual DDR components.

FIG. 5 is a logic flow diagram illustrating a routine 500 for making rank-specific timing adjustments for individual DDR components. Routine 500 begins at 505, in which the MCH 100 receives a READ tenure, which includes a READ command and the address of the data targeted to be read in the DDR component. At 510, the READ tenure is passed to a Command Tenure FSM 105, which calculates the rank of the DDR memory component where the targeted data is stored.

At 515, the calculated rank is used as a pointer to retrieve the RECVEN_DLY and DQS_OFFSET signals associated with the particular rank and DDR component from a look-up table. The RECVEN_DLY signal contains a whole portion and a fractional portion, which are specific to a given rank in the DDR memory 135. The whole portion identifies the gross timing adjustment in terms of multiple clock pulses associated for a given rank of the DDR memory. The fractional portion of the RECVEN_DLY identifies the fine timing adjustment associated with a specific component within the given rank in terms of fractions of the clock pulse. The DQS_OFFSET signal is used by the DDR I/O Cell 130, to adjust the timing of the data strobe signal to synchronize the eye of the data strobe pulses with the data pulse to minimize the DDR timing margins. The DQS_OFFSET signal is on the order of picoseconds and is used for very fine timing adjustments to the data strobe signal.

At 520, the RECVEN_DLY signal and the DQS_OFFSET signal are input to a Data Tenure Pipeline 115. The Data Tenure Pipeline 115 is a configurable pipeline, which can impart a delay to the RECVEN_DLY and DQS_OFFSET values so that they arrive at the DDR I/O Cell 135 at the appropriate time to be used with the data tenure for any given rank within the DDR memory. The Data Tenure Pipeline 115 extracts the whole portion of the RECVEN_DLY signal and delays the delivery of the fractional portion of the RECVEN_DLY signal and the DQS_OFFSET signal by an amount of time equal to the value of the whole portion. Once the appropriate delay has been applied to by the Data Tenure Pipeline 115, the fractional portion of the RECVEN_DLY and the DQS_OFFSET signals are input to the DDR I/O Cells 130 through the Crossbar 120. At 525, the fractional portion of the RECVEN_DLY signal is input into an adjustable pipeline 220 within the DDR I/O Cell 130. The adjustable pipeline 220 uses the value of the fractional portion of the RECVEN_DLY signal to adjust a gating signal to a fraction of a clock pulse. Thus, the fraction portion "fine tunes" the gating signal so that the RECVEN signal is adjusted in time properly to fully gate the data strobe pulses. The gated data strobe signals are then delayed by ¼ clock delay to insure that the eye data pulses coincide with the transition portion of the gated strobe pulses so that the data can be clocked out of the flip-flop 260. The DQS_OFFSET is applied to the ¼ clock circuit to fine tune the position of the shifted data strobe pulses to insure that the eye of the data strobe signal is centered on the transitions of the of the read data pulses.

Other alternative embodiments will become apparent to those skilled in the art to which an exemplary embodiment pertains without departing from its spirit and scope. Accordingly, the scope of the present invention is defined by the appended claims rather than the foregoing description.

We claim:

1. A system, comprising:
   a table comprising a first timing adjustment signal associated with a rank of a memory component and a second timing adjustment signal associated with the memory component;
   a pipeline for imparting a gross timing delay for adjusting a data strobe signal associated with the memory component using a first portion of the first timing adjustment signal; and
   a memory cell connected to the pipeline operable for:
   receiving at least a second portion of the first timing adjustment signal; and
   further adjusting the data strobe signal using the second portion by an amount less than the amount of the first portion.

2. The system of claim 1 further comprising a module for measuring a distribution rate of the data strobe signal and a rate of a data bit arrival time across the memory component.

3. The system of claim 2 further comprising a read data buffer operable for receiving the read data from the memory component and outputting the read data.

4. The system of claim 1, further comprising:
a finite state machine (FSM) operable for determining the rank of at least one memory component from an address associated with the data to be read from the memory component.

5. The system of claim 1, wherein the memory component is a dual data-rate (DDR) memory component.

6. The system of claim 1, wherein the first portion adjusts the data strobe by multiples of a clock pulse, and wherein the second portion adjusts a position of the data strobe signal by fractions of the clock pulse.

7. The system of claim 1, wherein the second timing adjustment signal is operable for adjusting the data strobe signal.

8. The system of claim 1, wherein the memory cell comprises:
an adjustable pipeline for receiving second portion of the first adjustment signal;
a pulse stretch circuit for generating a gating signal for the data strobe signal;
a logical gate for combining the gating signal with the data strobe signal from the memory component to produce a gated data strobe signal;
a delay clock circuit operable for:
imparting a predefined time delay on the gated data strobe signal; and
adjusting the timing of the data strobe to coincide with a data pulse; and
a logic gate for reading out the data.

9. The system of claim 1, wherein the table is located in a memory controller hub (MCH).

10. The system of claim 1, wherein the table is located within the memory component.

11. A method, comprising:
calculating a rank of a DDR memory component from a command tenure;
extracting at least one timing adjustment signal from a look-up table associated with the calculated rank; and
using the at least one timing adjustment signal to adjust a gating circuit for gating a data strobe signal to account for timing variations for reading data in a memory component
wherein the at least one timing adjustment signal comprises a first portion and a second portion,
wherein the first portion is used to grossly adjust the gating signal using integer multiples of a clock signal, and
wherein the second portion is used to finely adjust the position of the gating signal using fractions of the clock signal.

12. The method of claim 11, further comprising
extracting a second timing adjustment signal from the look-up table associated with the calculated rank and memory component; and
using the second timing adjustment signal to synchronize the gated data strobe signal with a data signal.

13. The method of claim 11, wherein the command tenure comprises a read command and an address associated with the data.

14. The method of claim 11, further comprising: shifting the gated data strobe signal by ¼ of a clock pulse.

15. The method of claim 14, further comprising: using the shifted data strobe signal to trigger a flip-flop for reading the data.

16. A memory cell; comprising:
an adjustable pipeline operable for:
receiving a fractional portion of a first adjustment signal, the fractional portion having a first value; and
adjusting timing of a gating signal by a length of time equal to the value of the fractional portion of the first adjustment signal;
a pulse stretch circuit for stretching the gating signal in time;
a logical gate for combining the stretched gating signal with a data strobe signal from a targeted memory component to produce a gated data strobe signal;
a delay clock circuit operable for:
imparting a predefined time delay on the gated strobe signal; and
adjusting the timing of the delayed data strobe signal to coincide with a read data pulse; and
a circuit for reading out the data.

17. The memory cell of claim 16, wherein the delay clock circuit is further operable for
receiving a second adjustment signal having a predefined value; and
using the predefined value of the second adjustment signal to adjust the time of the delayed data strobe signal.

18. The memory cell of claim 16, wherein the predefined delay is equal to ¼ of a system clock pulse.

19. The memory cell of claim 18, wherein the value of the fractional portion of the first adjustment signal comprises a fraction portion of the system clock pulse.

* * * * *